US012518942B2

(12) United States Patent
Kotsuji et al.

(10) Patent No.: US 12,518,942 B2
(45) Date of Patent: Jan. 6, 2026

(54) CHARGED PARTICLE BEAM DEVICE

(71) Applicant: Hitachi High-Tech Corporation, Tokyo (JP)

(72) Inventors: Hideyuki Kotsuji, Tokyo (JP); Toshiyuki Yokosuka, Tokyo (JP); Hajime Kawano, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 435 days.

(21) Appl. No.: 18/319,554

(22) Filed: May 18, 2023

(65) Prior Publication Data

US 2023/0411108 A1 Dec. 21, 2023

(30) Foreign Application Priority Data

Jun. 16, 2022 (JP) ................................ 2022-097052

(51) Int. Cl.
*H01J 37/02* (2006.01)
*H01J 37/28* (2006.01)

(52) U.S. Cl.
CPC ............ *H01J 37/026* (2013.01); *H01J 37/28* (2013.01); *H01J 2237/103* (2013.01); *H01J 2237/2007* (2013.01)

(58) Field of Classification Search
CPC .. H01J 37/00; H01J 37/02; H01J 37/26; H01J 37/026; H01J 37/28; H01J 2237/103; H01J 2237/2007; H01J 2237/022
USPC ................................ 250/306, 307, 310, 311
See application file for complete search history.

(56) References Cited

U.S. PATENT DOCUMENTS

2002/0142496 A1* 10/2002 Nakasuji ............ G01N 23/2251 250/492.3
2005/0045821 A1 3/2005 Noji et al.
2005/0279934 A1* 12/2005 Stewart ................. H01J 37/244 250/309
2019/0304737 A1* 10/2019 Ogasawara ........... H01J 37/141
2022/0059326 A1* 2/2022 Jiang ................. H01J 37/32871

FOREIGN PATENT DOCUMENTS

JP 2007-149449 A 6/2007
JP 2014-112087 A 6/2014

* cited by examiner

*Primary Examiner* — Jason L McCormack
(74) *Attorney, Agent, or Firm* — Volpe Koenig

(57) ABSTRACT

A charged particle beam device includes: a plasma generation device attached to a sample chamber through a connecting member; a guide including a hollow portion configured to guide a plasma generated by the plasma generation device in a direction toward a stage; a first voltage source configured to apply a voltage to the stage; and a second voltage source configured to adjust the plasma generation device and the guide to a predetermined potential, in which the guide is disposed to avoid an opening of an objective lens through which a charged particle beam passes and to position a tip of the guide between the objective lens and the stage.

12 Claims, 12 Drawing Sheets

CHARGED PARTICLE BEAM DEVICE

CROSS-REFERENCE TO RELATED APPLICATION

This application claims priority to Japanese Patent Application No. 2022-097052, filed on Jun. 16, 2022, the entire contents of which are incorporated by reference herein.

BACKGROUND OF THE INVENTION

1. Field of the Invention

The present invention relates to a charged particle beam device.

2. Description of Related Art

Along with miniaturization and high integration of a semiconductor pattern, a slight shape difference of a pattern affects operating properties of a device. Therefore, needs for shape management of the pattern of the device have increased. Due to this reason, for a scanning electron microscope (SEM) as a charged particle beam device used for inspecting and measuring a semiconductor, high sensitivity and high accuracy measurement is further required than in the related art. The scanning electron microscope controls electrons using a magnetic field and an electrostatic lens to scan a sample with the electrons. Secondary electrons are emitted from the sample by electron beam scanning. The secondary electrons emitted from the sample are detected using a detector, a signal waveform of the secondary electrons is generated, and for example, a dimension between peaks (pattern edges) can be measured.

In the wafer inspection in the manufacturing process, early detection of foreign matter, defects, or the like leads to improvement in yield. Therefore, needs for inspecting the entire surface of a wafer to detect defects have increased, but there is a problem in that the inspection of the entire surface leads to a decrease in throughput. In order to increase the throughput, it is considered to inspect a wide range of field of view at once using low magnification imaging by a high current. However, the influence of low magnification imaging on the charging of a sample is visualized, and distortion, brightness unevenness, or the like may occur in the acquired image. Since the charging of sample causes a decrease in the measurement accuracy of a SEM, it is necessary to effectively remove the charge.

As a method of reducing the influence of charging, for example, a method of coating a sample with a conductor to suppress charging or an yield control of secondary electrons by voltage adjustment of primary electrons to be irradiated is known. However, it is difficult to apply the method to in-line inspection. In addition, a material or imaging conditions of a SEM also affect a charged state. Therefore, adjustment for each of materials or patterns of samples is difficult and not realistic. Thus, charge removal or charge control that does not depend on samples is necessary.

JP2007-149449A discloses a device for preventing charge contamination that generates ions for preventing sample charging and generates a plasma for removing contamination, in which the ions or the plasma is selectively emitted from the device to irradiate a target to be measured with the ions or the plasma for preventing the charging of the target and removing contamination. At this time, the ion or the plasma is emitted to an irradiation position of an electron beam in a sample using an introduction tube.

JP2014-112087A discloses a plasma irradiation type pre-charge unit as a charge-up suppressing unit that prevents unevenness in charge amount generated by primary electron beam irradiation of a SEM. By setting the bias potential of the pre-charge unit to 0 V, a sample substrate is irradiated with a plasma emitted by a gas pressure.

In JP2014-112087A, the plasma irradiation can be performed by controlling the bias voltage of the pre-charge unit. However, a method of causing the plasma to propagate to the vicinity of a sample is not considered. In JP2007-149449A, the plasma or the ions are caused to propagate to the vicinity of a charging site using the introduction tube, and an electron beam is controlled by a magnetic lens or an electrostatic lens in a SEM. However, the insertion of the introduction tube into the vicinity of a sample may affect the magnetic field or the electric field that controls the electron beam in the SEM.

SUMMARY OF THE INVENTION

The present invention has been made in consideration of the above-described problems, and an object thereof is to provide a charged particle beam device that can perform static elimination or charge control using a plasma or charged particles generated by the plasma without any influence on a control of a charged particle beam.

According to one embodiment of the present invention, there is provided a charged particle beam device including: a sample chamber including a stage on which a sample is placed; a charged particle beam optical system configured to irradiate the sample with a charged particle beam; a plasma generation device attached to the sample chamber through a connecting member; a guide including a hollow portion configured to guide a plasma generated by the plasma generation device in a direction toward the stage; a first voltage source configured to apply a voltage to the stage; and a second voltage source configured to adjust the plasma generation device and the guide to a predetermined potential, in which the charged particle beam optical system includes an objective lens configured to focus the charged particle beam on the sample, and the guide is disposed to avoid an opening of the objective lens through which the charged particle beam passes and to position a tip of the guide between the objective lens and the stage.

The present invention can provide a charged particle beam device that can perform static elimination or charge control without any influence on a control of a charged particle beam.

Details of at least one embodiment of the subject disclosed in the present specification will be described below with reference to the accompanying drawings. Other characteristics, aspects, and effects of the disclosed subject will be clarified using the following disclosure, the drawings, and the claims.

DESCRIPTION OF EMBODIMENTS

Figure 1:
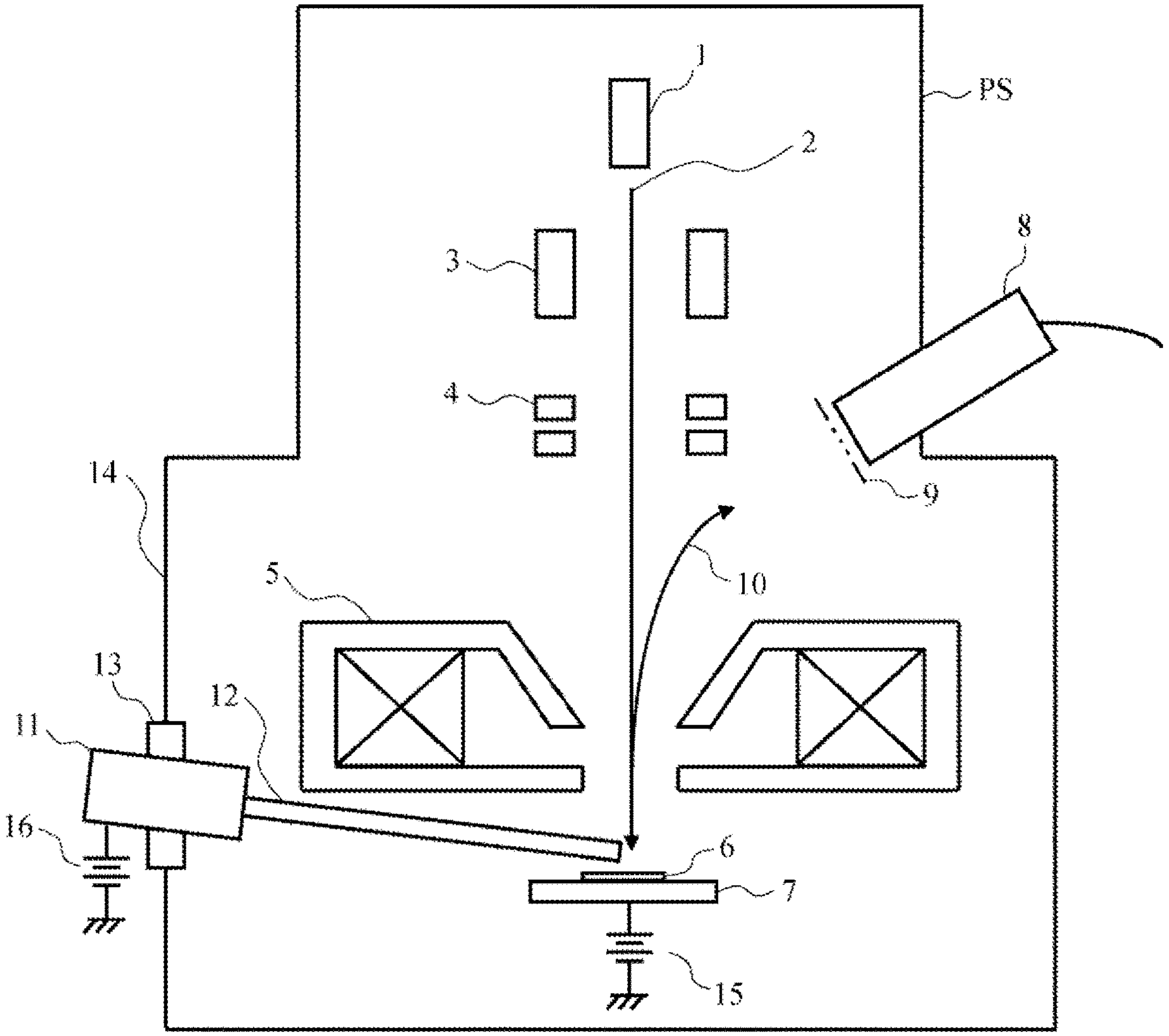
FIG. 1 is a schematic view illustrating a charged particle beam device according to a first embodiment.

Hereinafter, an embodiment will be described with reference to the accompanying drawings. In the accompanying drawings, functionally the same elements may also be represented by the same reference numerals. The accompanying drawings illustrate embodiments and implementations based on the principle of the present disclosure. These drawings are examples for easy understanding of the present disclosure and are not used to limit the present invention. The description of the present specification is merely a typical example and does not limit the claims or application examples of the present disclosure by any means.

In the embodiment, the present disclosure is described in detail sufficient for a person skilled in the art to implement the present disclosure, but other embodiments and configurations can also be adopted. It should be understood that changes of configurations and structures and replacement of various elements can be made within a range not departing from the scope and concepts of the technical idea of the present disclosure. Accordingly, the following description should not be interpreted as being limited to the present disclosure.

First Embodiment

A charged particle beam device according to a first embodiment will be described with reference to FIG. 1. The charged particle beam device includes, for example, an electron beam optical system (charged particle beam optical system) including an electron gun 1, a condenser lens 3, a deflector 4, and an objective lens 5. A sample chamber 14 including a stage 7 for mounting a sample 6 is provided below the electron beam optical system PS.

The electron beam 2 (primary electron beam) that is generated and accelerated by the electron gun 1 is focused by the condenser lens 3, and is further focused on the sample 6 on the stage 7 by the objective lens 5. The deflector 4 (scanning deflector) deflects the electron beam 2 to scan an electron beam scanning region of the sample 6. By irradiating the sample 6 with the electron beam 2 while scanning the sample 6, electrons excited in the sample 6 are emitted from the sample 6 as secondary electrons 10. The emitted secondary electrons 10 are detected by a secondary electron detector 8, and an arithmetic unit (not illustrated) connected to the secondary electron detector 8 visualizes a detection signal thereof.

In a front stage (incidence surface side) of the secondary electron detector 8, an energy filter 9 capable of classifying signal electrons by energy is provided. The charged state of the sample 6 can be estimated based on a change in detection signal when a voltage to be applied to the energy filter 9 is changed.

The energy of the electron beam 2 (primary electron beam) that is deflected to scan the sample 6 is determined depending on an acceleration voltage of the electron gun 1 and a voltage (retarding voltage) to be applied from a voltage source (first voltage source) 15 to the stage 7. The amount of the secondary electrons 10 to be emitted relates to the energy of incident primary electrons, and the charged state of the surface of the sample 6 changes depending on a magnitude relationship between an electron current of primary electrons 2 and an electron current of the secondary electrons 10. The charge amount of the sample 6 also changes depending on material properties, a shape, or the like of the sample 6. In addition, the charge amount of the sample 6 is also not uniform on the entire surface of the sample 6, and has a distribution that changes depending on positions of the surface of the sample 6 due to the material properties, the shape, or the like.

The charged particle beam device according to the embodiment includes a plasma generation device 11 that generates a plasma, in which in order to remove the charge of the sample 6, a plasma generated from the plasma generation device 11 or charged particles such as electrons or ions generated from the plasma are emitted to the stage 7 on which the sample 6 is placed. The plasma generation device 11 includes a guide 12 that guides the plasma or the charged particle to the sample 6 on the sample chamber 14 side. The guide 12 is formed of metal and includes a hollow portion for moving the plasma or the charged particles. The plasma or the charged particles pass through the hollow portion and are emitted from a tip of the guide 12.

The plasma generation device 11 is attached to a wall surface of the sample chamber 14 using a connecting member 13 including an insulating spacer. The insulating spacer is formed of, for example, an insulating material such as a ceramic and has a function of electrically insulating the plasma generation device 11 from the sample chamber 14. Since the plasma generation device 11 is insulated from the sample chamber 14, the potential of the sample chamber 14 can be stably maintained irrespective of the operating state of the plasma generation device 11. Further, the potential of the plasma generation device 11 and the guide 12 can be freely controlled by a voltage source (second voltage source) 16 connected to the plasma generation device 11. Separately from the voltage source 16, the plasma generation device 11 includes a high frequency power supply (not illustrated) for generating a plasma.

Figure 2:
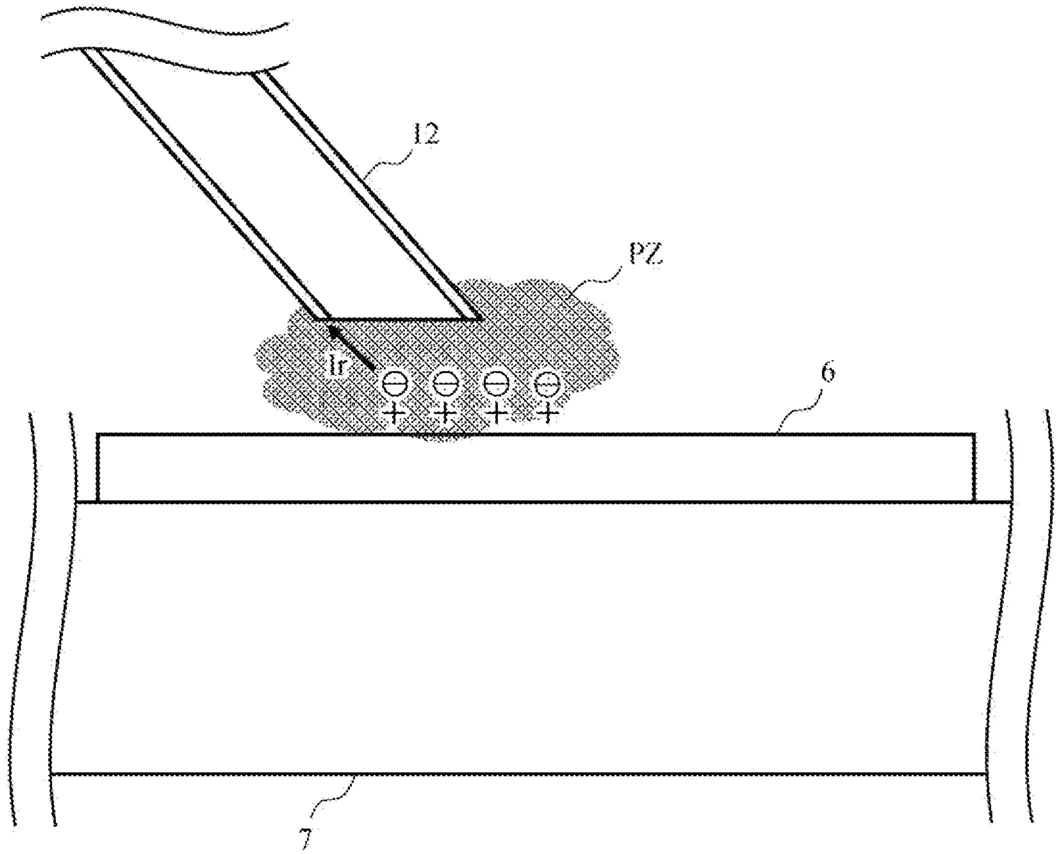
FIG. 2 is a diagram illustrating a static elimination operation of a sample by a plasma.

A static elimination operation of the sample 6 by a plasma PZ generated from the plasma generation device 11 will be described with reference to FIG. 2. The plasma PZ includes electrons and positive ions and is typically in an electrically neutral state. Here, assuming that the sample 6 is positively charged, when the sample 6 is irradiated with the plasma PZ, the positive charge of the sample 6 is neutralized by the electrons in the plasma PZ. As a result, the amount of the electrons in the plasma PZ decreases, the charge balance in the plasma PZ collapses, and the current finally flows to a ground potential point through the plasma PZ such that static elimination is performed on the sample 6. When the sample 6 is negatively charged, static elimination is performed on the sample 6 using the same method as described above, except that the polarities of the elements are reversed.

The function of the guide 12 will be described. The plasma PZ generated by the plasma generation device 11 has no directivity. Therefore, when the guide 12 is not provided, the plasma PZ is diffused from the plasma generation device 11 into the sample chamber 14 by an electric field of the plasma PZ itself and natural diffusion. Unless an electric field or the like works, the plasma PZ is diffused into the sample chamber 14. The plasma PZ is attracted to an electric field generated by the charging of the sample 6 such that the charge of the sample 6 can be removed (static elimination). However, in the electron beam optical system PS, the condenser lens 3 or the like for controlling the electron beam 2 is disposed, and an electric field distribution is present in the sample chamber 14. This electric field distribution affects the behavior of the plasma PZ. When the influence of the electric field applied by the condenser lens 3 or the like is large, there may be an influence on the static elimination operation by the plasma PZ. In addition, when there is a structure having a higher potential than the electric field distribution generated by the charge of the sample 6, the charged particles in the plasma PZ are attracted to the structure such that the charge of the sample 6 cannot be sufficiently removed by the plasma PZ.

On the other hand, by providing the guide 12, the plasma PZ can be guided to the vicinity of the sample 6. Since the guide 12 is formed of metal, the potential in the guide 12 is uniform in the length direction of the guide 12, and thus the sample 6 can be irradiated with the plasma PZ without any influence of an external electric field. As a result, the electrons or the positive ions in the plasma PZ neutralize the charge of the sample 6 such that the charge of the sample 6 is removed. The charge of the sample 6 flows to the guide 12 as a static elimination current Ir through the plasma PZ.

Here, the stage 7 is configured to be applied with the retarding voltage. The retarding voltage is a voltage for decelerating the electrons of the electron beam 2. The electron beam 2 irradiated from the electron gun 1 is focused by the condenser lens 3, the objective lens 5, or the like and is irradiated to the sample 6. The acceleration voltage of the electron beam 2 irradiated from the electron gun 1 has increased in order to improve the resolution. When the energy of the electron beam 2 irradiated to the sample 6 is high, the generation efficiency of the secondary electrons 10 generated from the surface of the sample 6 decreases such that the charging of the sample 6 progresses. In addition, when the sample 6 is irradiated with the high-energy electrons, the sample 6 may be damaged. Therefore, the voltage (retarding voltage) for decelerating the electrons before irradiating the sample 6 is applied to the stage 7. As a result, the damage or charging of the sample 6 can be prevented while implementing high resolution of an image. The retarding voltage is applied by the voltage source 15 connected to the stage 7.

Figure 3A:
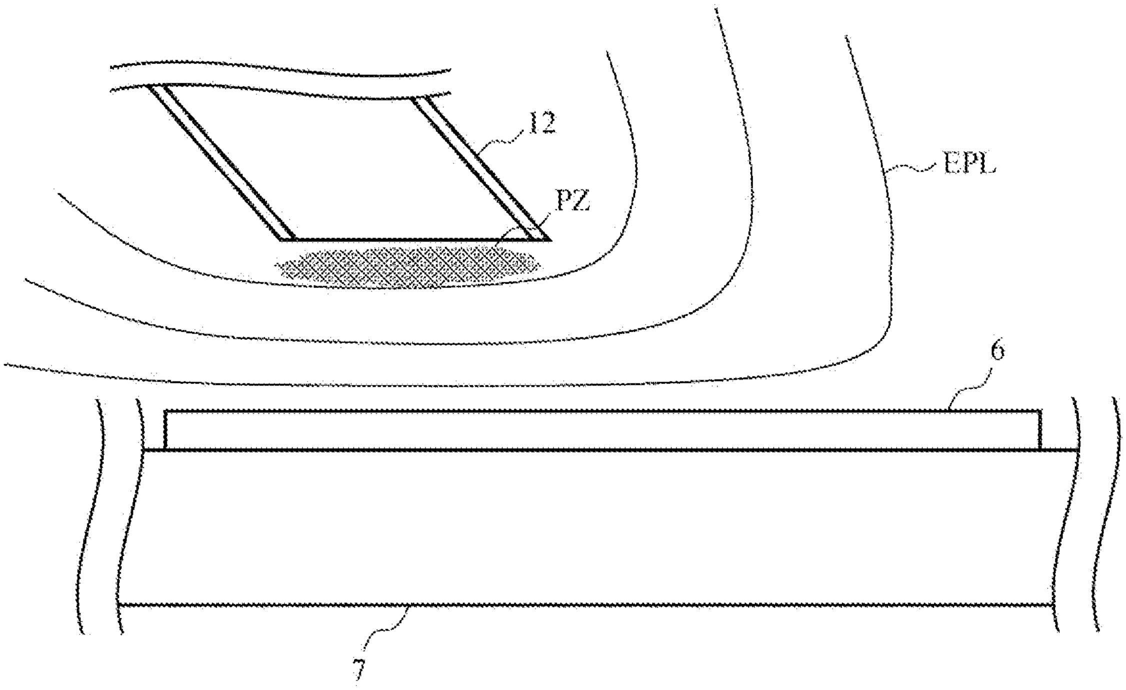
FIG. 3A is a diagram illustrating the behavior of a plasma.

The behavior of the plasma PZ emitted from the tip of the guide 12 in a state where the retarding voltage is applied to the stage will be described using FIG. 3A. As illustrated in FIG. 3A, the plasma PZ generated by the plasma generation device 11 passes through the inside of the guide 12 and moves to the vicinity of the sample 6 on the stage 7. A range from the plasma generation device 11 to the tip of the guide 12 is electrically connected and has the same potential. Therefore, the plasma PZ does not affect the electric field of the stage 7. However, since the retarding voltage is applied by the voltage source 15, a potential difference (potential) represented by an equipotential line EPL is generated in a gap between the tip of the guide 12 and the stage 7. Therefore, electrons having lower than the potential difference cannot reach the stage 7 and cannot contribute to the removal of the charge of the sample 6.

Figure 3B:
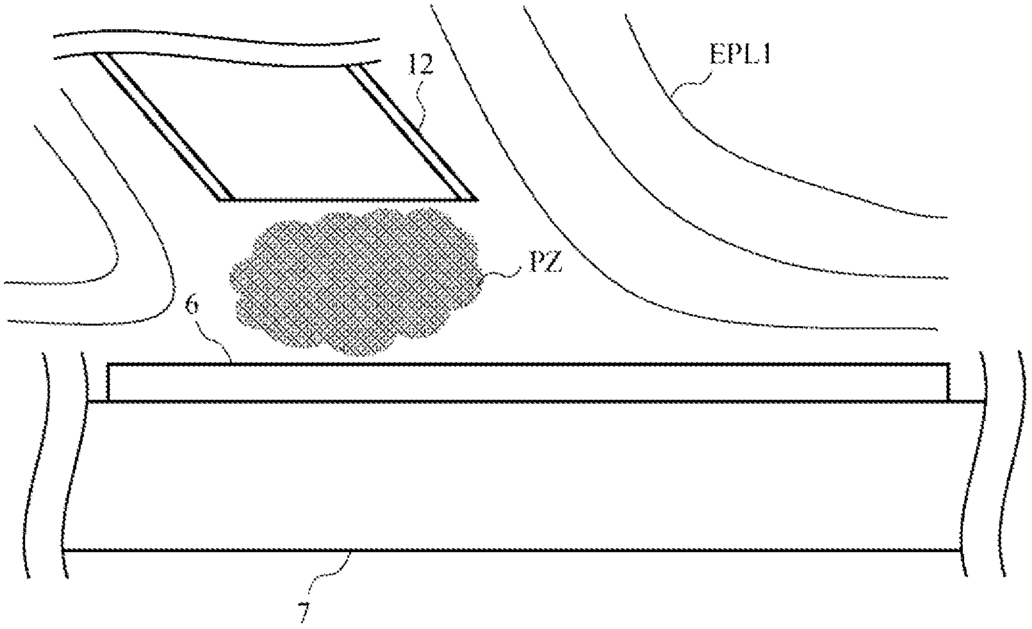
FIG. 3B is a diagram illustrating the behavior of a plasma.

On the other hand, when the same voltage as that of the stage 7 is applied to the plasma generation device 11 and the guide 12 by the voltage source 16, the guide 12 and the stage 7 can be made to have substantially the same potential, the potential distribution (the equipotential line EPL1) illustrated in FIG. 3B can be obtained in the vicinity of the tip of the guide 12, there is no potential difference between the plasma generation device 11 and the guide 12 and the stage 7, and static elimination can be effectively executed by irradiating the sample 6 with the plasma PZ from the tip of the guide 12.

By using the guide 12 formed of metal, the stage 7 to which the retarding voltage is applied can also be irradiated with the plasma. However, the insertion of the structure formed of metal to which the voltage is applied into the vicinity of the sample may affect the electric field of the electron beam optical system PS that controls the electron beam 2.

Figure 4:
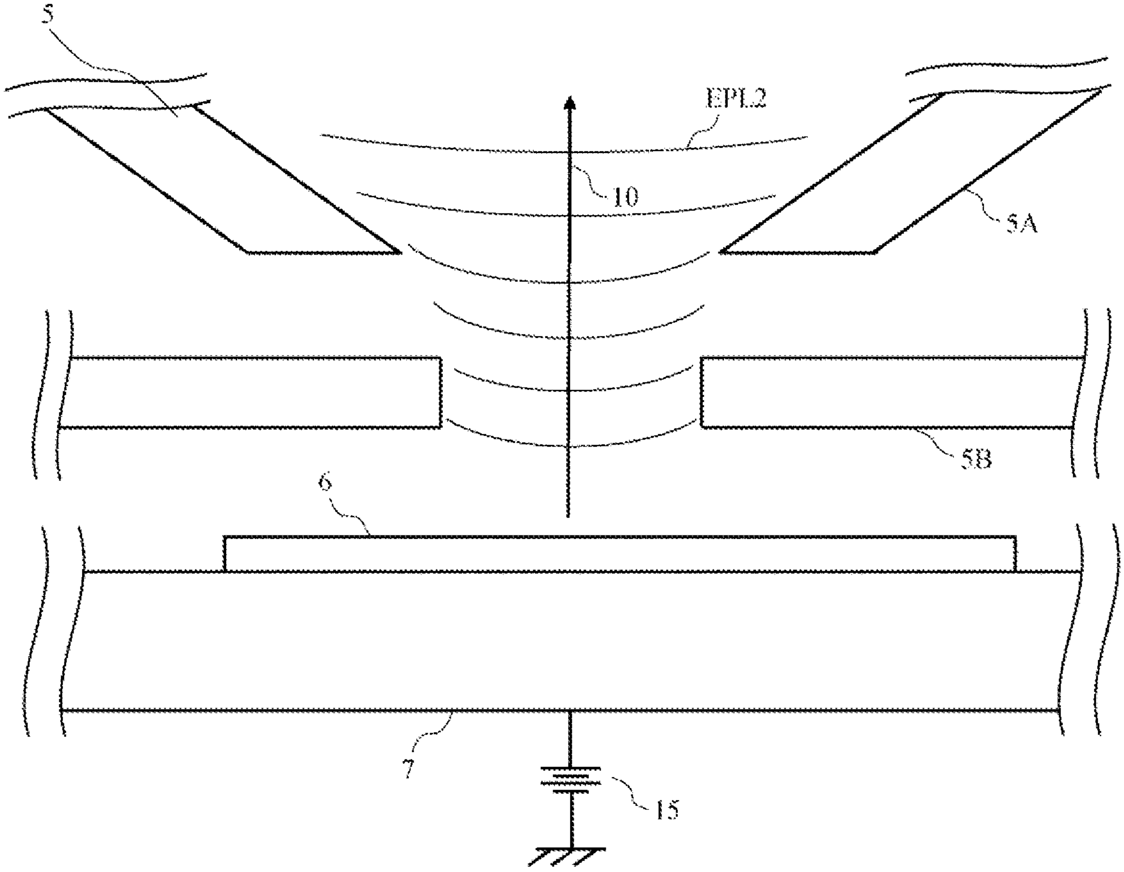
FIG. 4 is a diagram illustrating an electric field in the vicinity of a stage.

The electric field in the vicinity of the stage 7 will be described using FIG. 4. The electron beam 2 that is focused by the electron beam optical system PS is focused by the objective lens 5 and is deflected to scan the sample 6. Various lenses of the electron beam optical system PS adopt an axisymmetric structure. In addition, a voltage for boosting the secondary electrons 10 is applied to a booster electrode 5A of the objective lens 5. Therefore, an electric field for boosting the electrons upward as indicated by an equipotential line EPL2 in FIG. 4 is formed in the vicinity of the stage 7.

Figure 5:
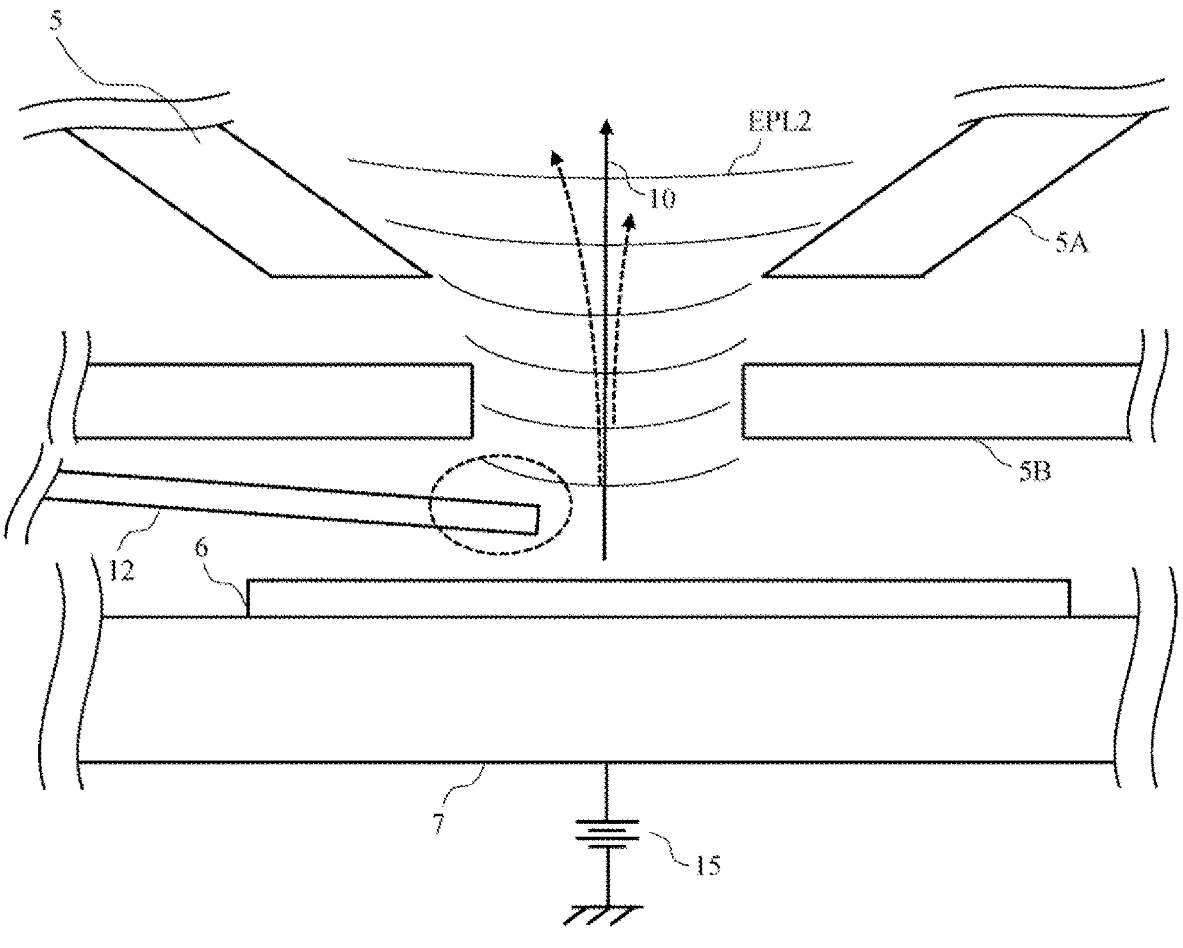
FIG. 5 is a diagram illustrating the influence of a guide on secondary electrons.

When the guide 12 is inserted between the stage 7 and the objective lens 5, the influence on the secondary electrons 10 will be described using FIG. 5. FIG. 5 illustrates an example where the guide 12 is disposed such that the tip of the guide 12 is positioned in an opening of the objective lens 5 through which the electron beam passes. Since the lenses that control the trajectory of the electron beam 2 have an axisymmetric shape with respect to an optical axis as a central axis, the electric field formed in the electron beam optical system PS is axisymmetric with respect to the optical axis. On the other hand, the guide 12 is inserted from the plasma generation device 11 provided in the sample chamber 14 and is asymmetric with respect to the optical axis. Therefore, when the guide 12 is disposed in the vicinity of the optical axis, the electric field formed in the tip portion of the guide 12 affects the equipotential line EPL2. That is, distortion is applied to the electric field formed axisymmetrically with respect to the optical axis. The distortion of the electric field affects the trajectory of the secondary electrons 10 and also affects the detection rate or the like of the secondary electron detector 8. Therefore, image distortion or the like may occur.

Figure 6:
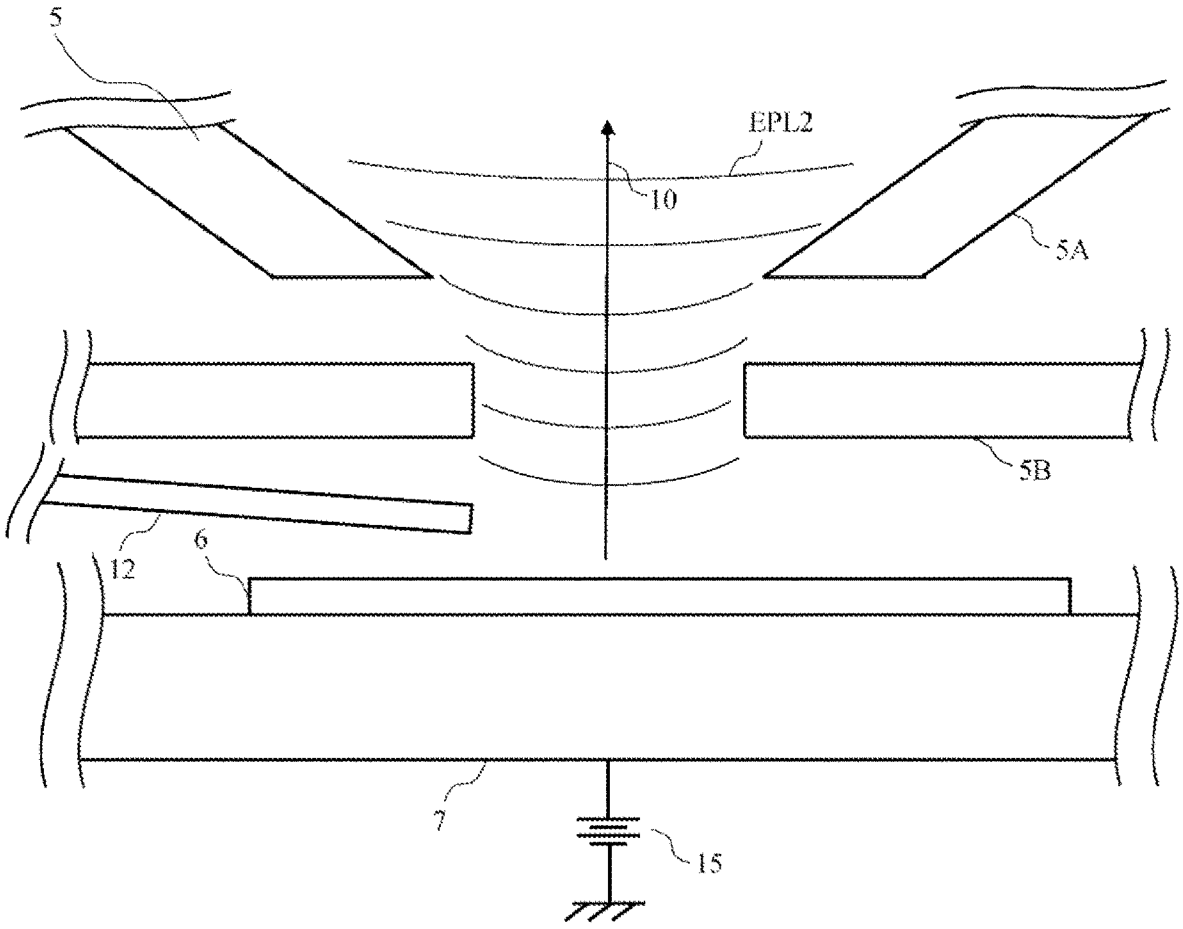
FIG. 6 is a diagram illustrating the influence of the guide on the secondary electrons.

In order to prevent the distortion of the electric field, the guide 12 may be disposed to prevent the electric field of the guide 12 from interfering with the equipotential line EPL2. Specifically, the guide 12 is disposed to avoid the opening of the objective lens 5 through which the electron beam 2 passes and to position the tip of the guide 12 between the objective lens 5 and the stage 7. The equipotential line EPL2 that is formed by the booster electrode 5A and the like is prevented from entering between the stage 7 and a lower magnetic path 5B of the objective lens 5 by the lower magnetic path 5B functioning as a shield. Therefore, as illustrated in FIG. 6, by disposing the tip position of the guide 12 between the lower magnetic path 5B and the stage 7 where the equipotential line EPL2 is not likely to enter, the occurrence of the electric field distortion can be prevented.

Figure 7:
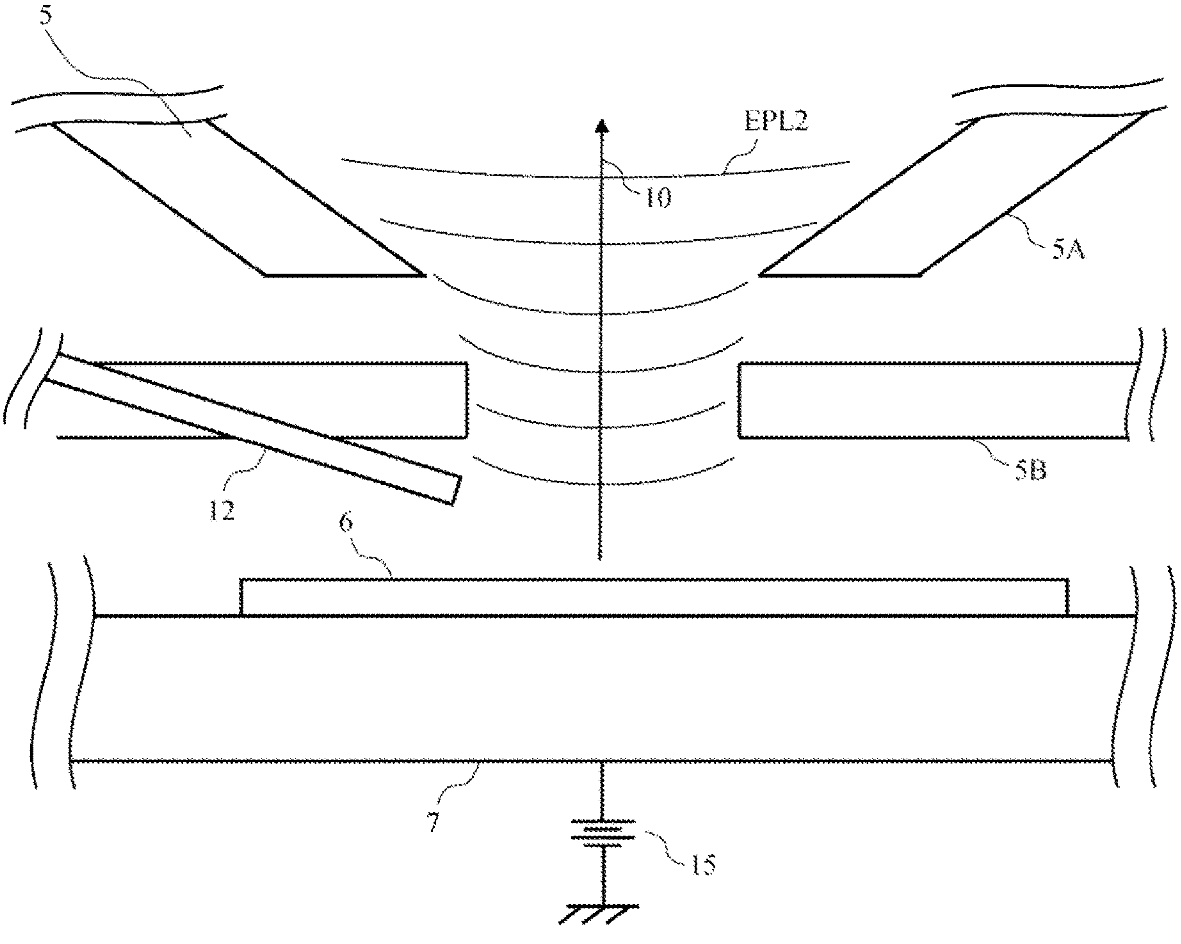
FIG. 7 is a diagram illustrating another insertion method of the guide.

Further, as illustrated in FIG. 7, the guide 12 may be inserted through the inside of the objective lens 5 or between other components. In the example of FIG. 7, in a state where a hole through which the guide 12 passes is formed in the electrode of the objective lens 5 and is electrically insulated from the objective lens 5, the guide 12 is disposed. Even in this case, the guide 12 is formed of metal such that the plasma or the charged particles can be introduced into the vicinity of the stage 7 without being affected by the electric field. The tip of the guide 12 is disposed between the lower magnetic path 5B and the stage 7 not to be affected by the electric field of the objective lens 5.

In the embodiment, an example of the charged particle beam device where an out-lens objective lens that ensures a long operating distance is used as the objective lens 5 is described. However, for example, the objective lens 5 may be a semi-in-lens objective lens. Even in this case, by disposing the tip of the guide 12 to avoid the opening of the objective lens through which the electron beam 2 passes, the influence on the electric field formed in the electron beam optical system PS can be avoided.

In the embodiment, the example where the charge of the sample 6 is removed by the plasma generated by the plasma generation device 11 is described. However, the balance of the electrons or the ions as the charged particles may collapse while the plasma from the plasma generation device 11 is being diffused. For example, the electrical neutrality of the plasma may deteriorate when regions having charged particle distributions are formed, for example, a sheath is formed on the wall surface of the structure due to a difference in mobility between the charged particles. That is, the balance between the number of positively charged particles and the number of negatively charged particles may collapse such that the electrical neutrality cannot be secured. Even in this case, as long as the sample can be irradiated with the electrons or the ions, static elimination or charge control can be performed without any problem. Accordingly, as described above, the guide 12 and the stage 7 can be made to have substantially the same potential, and the potential difference is applied between the plasma generation device 11 and the guide 12 and the stage 7. As a result, due to this potential difference, the electrons or the positive ions in the plasma can also be selectively irradiated to perform charge control.

Second Embodiment

Figure 8:
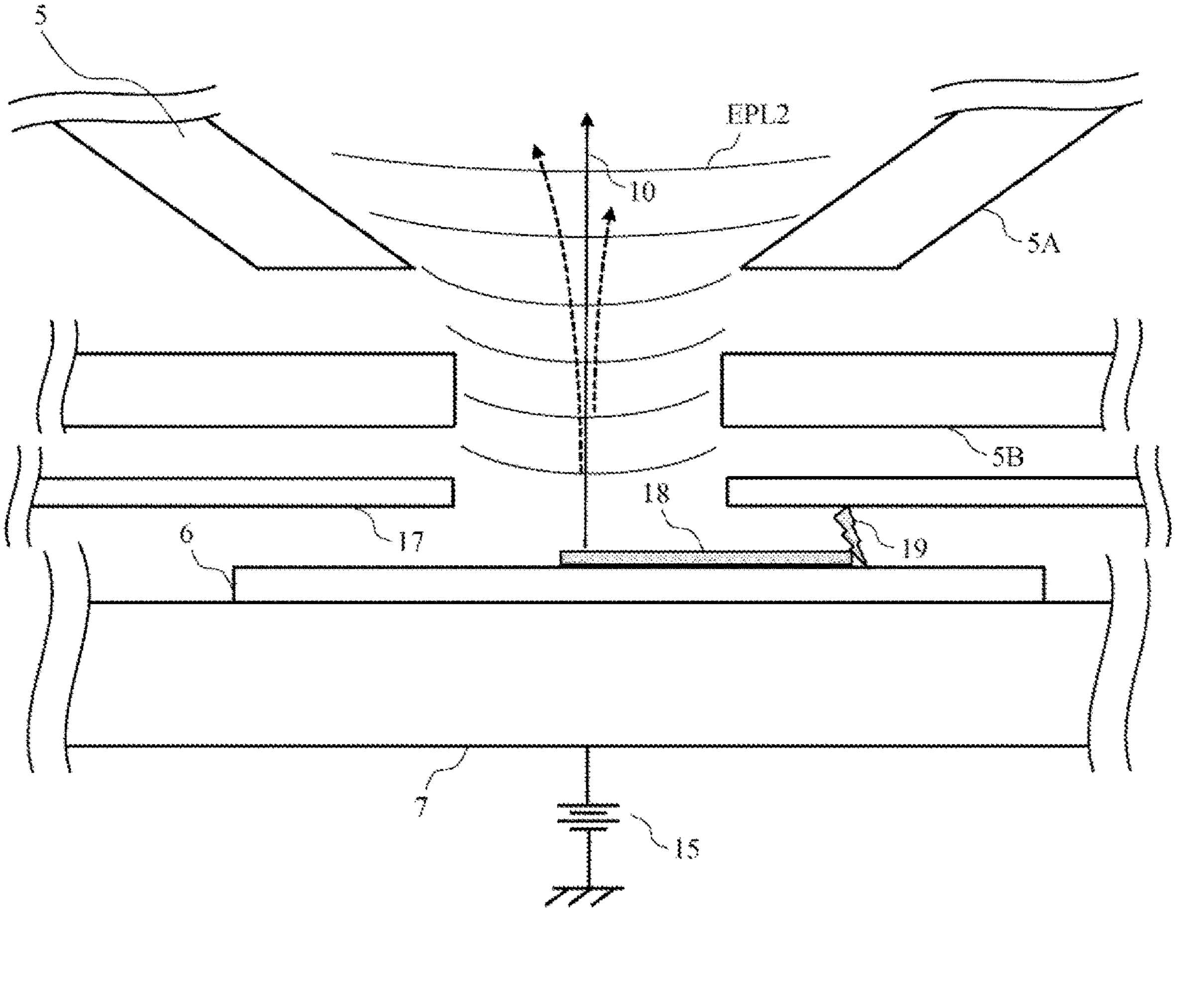
FIG. 8 is a diagram illustrating dielectric breakdown that occurs due to charging.

Next, a charged particle beam device according to a second embodiment will be described with reference to FIG. 8. The same components as those of the charged particle beam device according to the first embodiment are represented by the same reference numerals as those of FIG. 1, and the repeated description will not be made below. In the charged particle beam device according to the second embodiment, a trap plate 17 is provided between the stage 7 and the objective lens 5.

In the first embodiment, in the above-described embodiment of the objective lens 5, the configuration is described in which the tip of the guide 12 is disposed to avoid the opening of the objective lens through which the optical axis passes such that the electric field formed between the guide 12 and the stage 7 is shielded by the magnetic path of the objective lens 5 to prevent the electric field distortion of the electron beam optical system PS. In the second embodiment, the example of the charged particle beam device including the trap plate for preventing the floating of the sample 6 is described.

In the charged particle beam device, a wafer is fixed and transported using an electrostatic chuck. Due to the irradiation of the electron beam or the charge of the wafer, the sample may float from the electrostatic chuck. Therefore, the trap plate 17 having the same potential as the stage 7 is provided to face the stage. Incidentally, when charge 18 is generated in the sample 6, dielectric breakdown 19 may occur depending on the charge amount due to a potential difference generated by the charge 18. In order to prevent the dielectric breakdown 19, it is necessary to suppress the potential difference between the trap plate 17 and the sample 6 and to perform static elimination on the sample 6.

Figure 9:
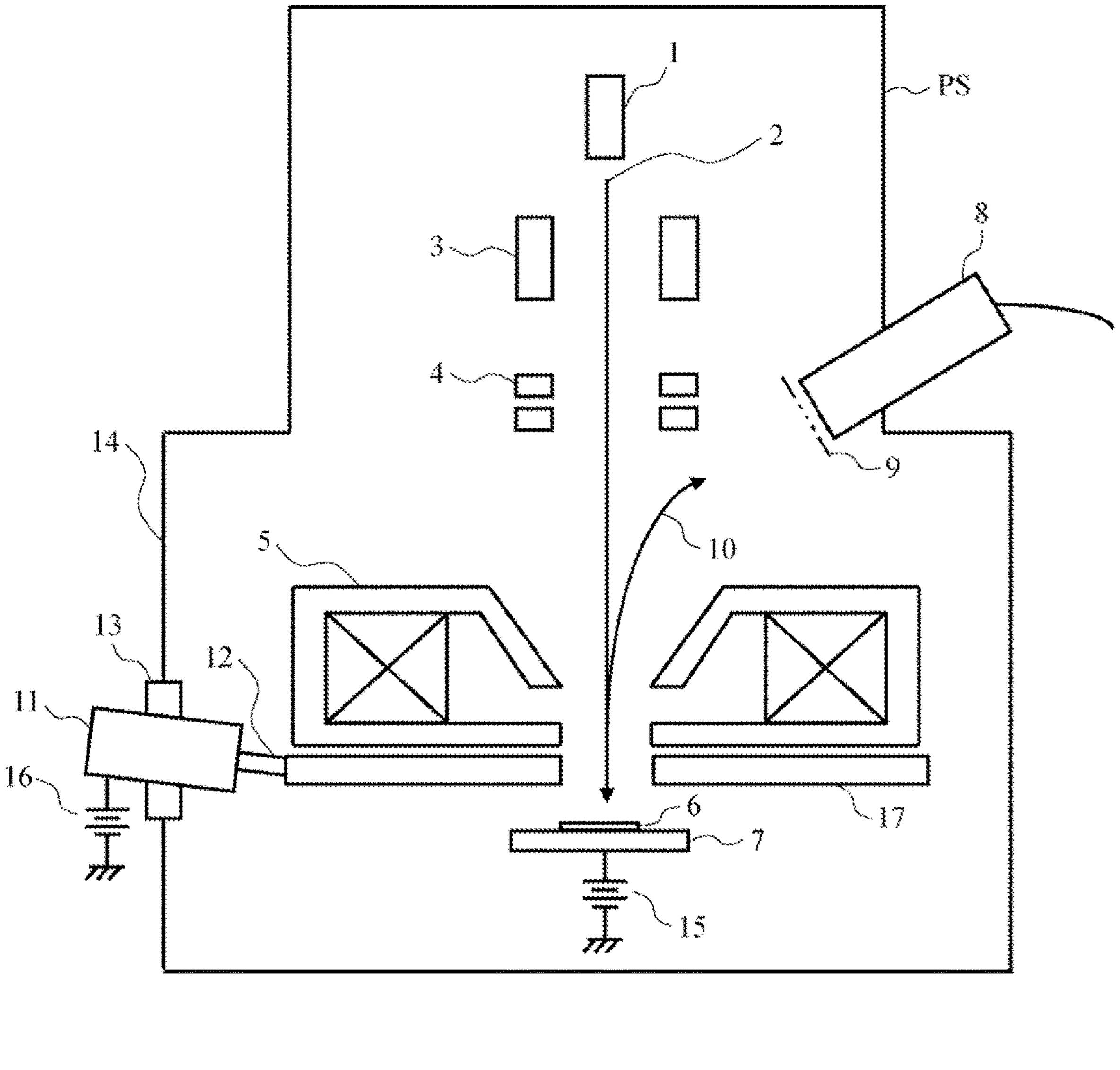
FIG. 9 is a schematic view illustrating a charged particle beam device according to a second embodiment.
Figure 10:
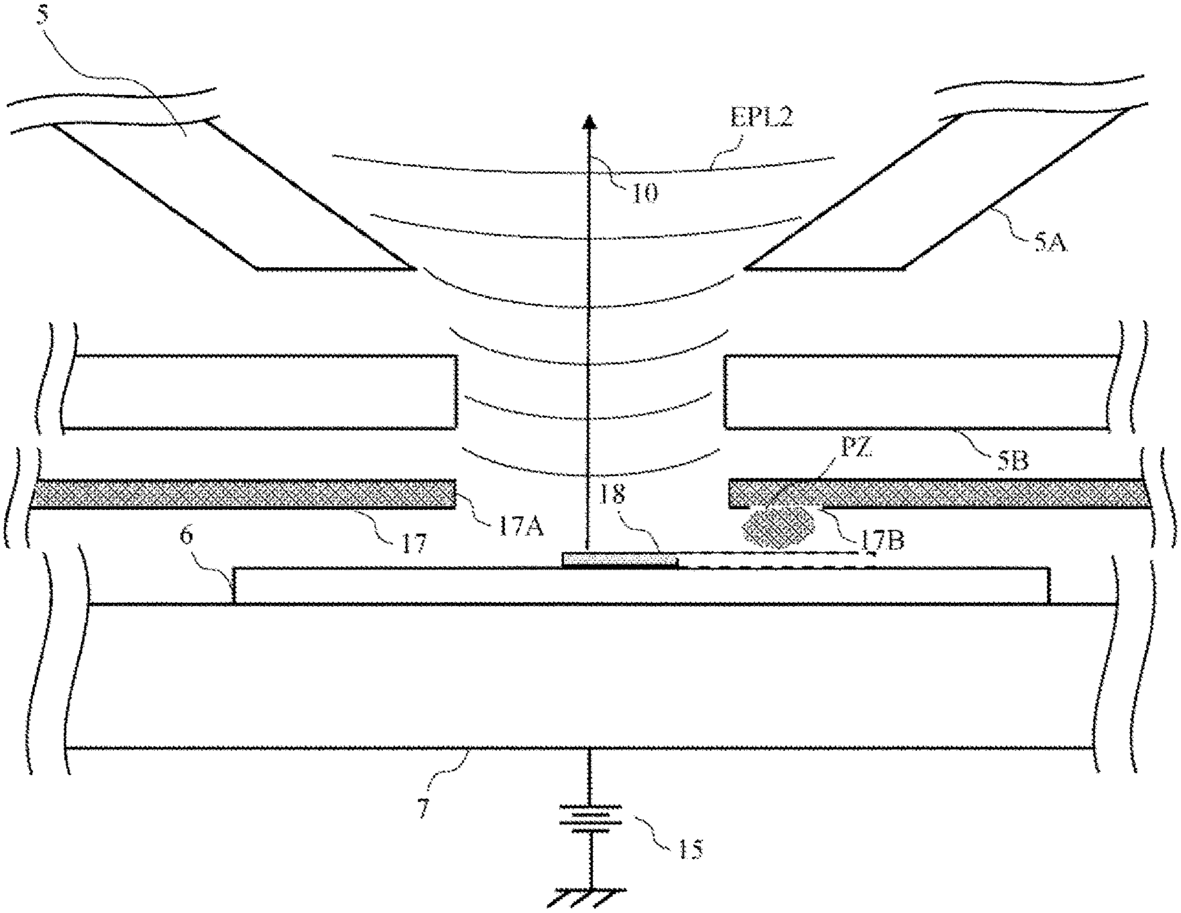
FIG. 10 is a schematic diagram illustrating a state where static elimination is performed on a plasma or charged particles emitted from an irradiation port.

The device configuration of the second embodiment will be described using FIGS. 9 and 10. As illustrated in FIG. 9, the plasma generation device 11 is connected to the trap plate 17 through the guide 12. The trap plate 17 has a hollow structure such that the plasma or the charged particles such as the electrons or the ions generated by the plasma can pass through the internal space. As a result, the trap plate 17 is filled with the plasma or the charged particles generated by the plasma generation device 11. By the plasma or the charged particles emitted to the sample 6 from an irradiation port 17B that is provided on an optical axis side of a surface of the trap plate 17 facing the stage 7, the charge generated by the electron beam irradiation can be removed, and the dielectric breakdown 19 generated between the sample 6 and the trap plate 17 can be prevented. In addition, the influence on the secondary electrons can also be reduced by a reduction in charging range.

Figure 11A:
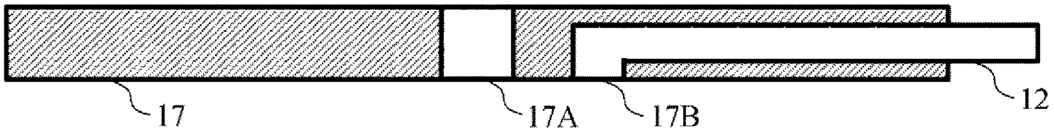
FIG. 11A is a cross-sectional view illustrating a trap plate.
Figure 11B:
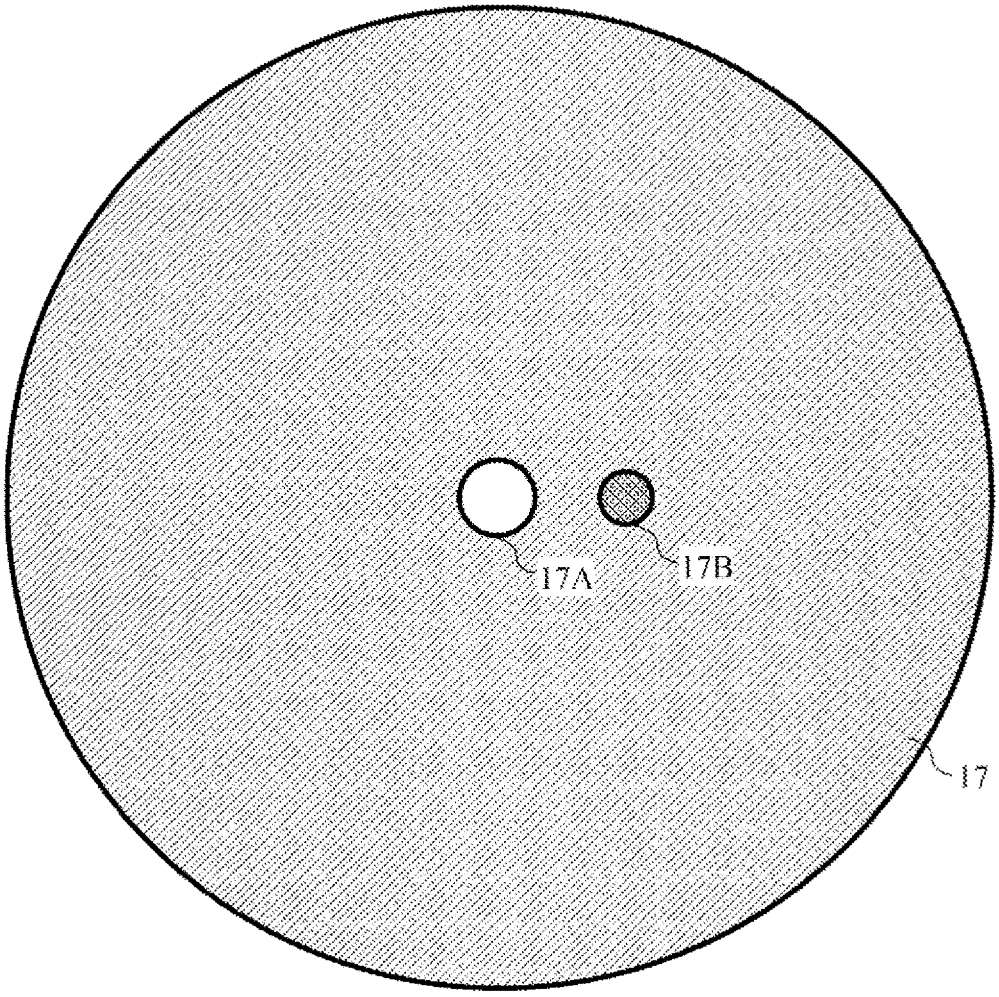
FIG. 11B is a bottom view illustrating the trap plate.
Figure 12:
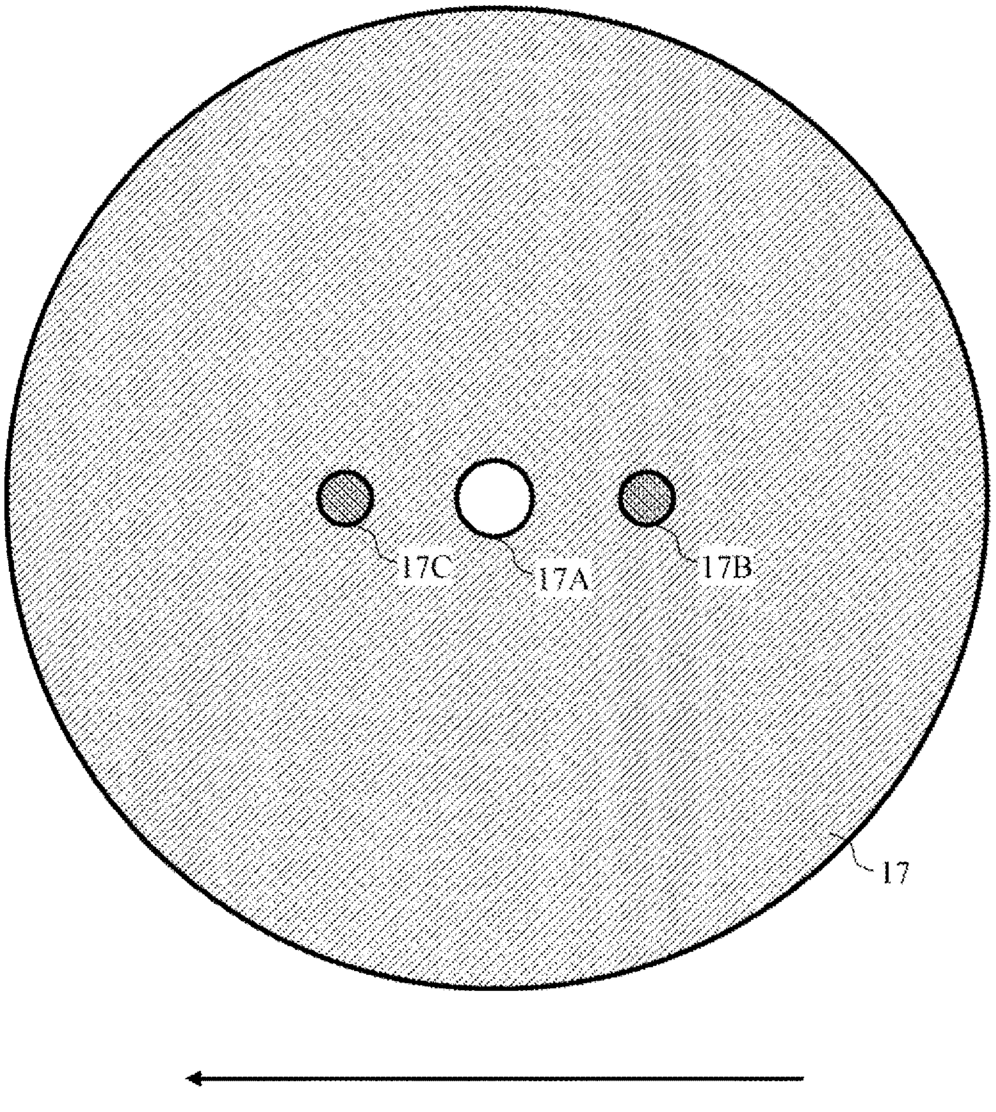
FIG. 12 is a bottom view illustrating the trap plate.

FIG. 11A is a cross-sectional view illustrating the trap plate 17, and FIG. 11B is a bottom view (the stage 7 side) illustrating the trap plate 17. In this example, in order to remove the charge 18 generated after the electron beam irradiation, the irradiation port 17B is disposed at one position on the right side of the paper plane with respect to a through hole 17A of the electron beam 2. However, the embodiment is not limited to this example. The internal space of the trap plate 17 is filled with the uniform plasma. Therefore, by providing an exit of the plasma at any location, the sample 6 can be irradiated with the plasma from any position. For example, in FIG. 12, an irradiation port (first irradiation port) 17B and an irradiation port (second irradiation port) 17C are provided such that the through hole 17A is interposed between the irradiation port 17B and the irradiation port 17C. When the stage 7 moves in an arrow direction illustrated in FIG. 12, the irradiation port 17B and the irradiation port 17C are provided in a movement direction such that the sample 6 can be irradiated with the plasma to perform the static elimination before and after the electron beam 2 irradiation. Further, the irradiation port has a concentric arc shape with respect to the through hole 17A of the electron beam 2 such that the plasma irradiation can be performed irrespective of the movement direction of the stage 7.

In addition, typically, the stage 7 and the trap plate 17 have the same potential. However, by using the voltage source 16 connected to the plasma generation device 11, a plasma to which a bias voltage is applied can be irradiated. In addition, due to the potential difference from the stage 7, the sample 6 can also be selectively irradiated with the electrons or the positive ions in the plasma to perform charge control.

Third Embodiment

Figure 13:
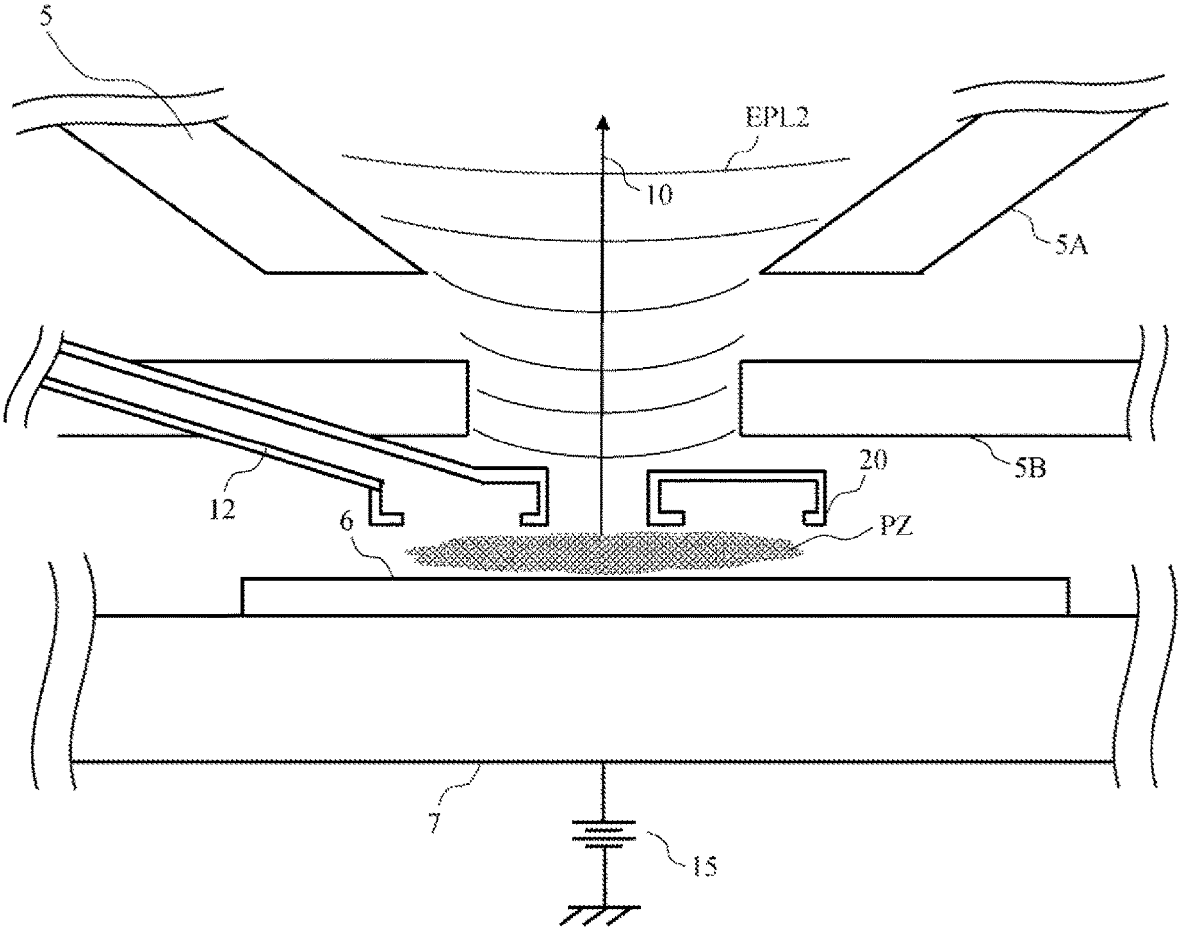
FIG. 13 is a diagram illustrating a tip structure of the guide according to a third embodiment.

Next, a charged particle beam device according to a third embodiment will be described with reference to FIG. 13. The same components as those of the charged particle beam device according to the first embodiment are represented by the same reference numerals as those of FIG. 1, and the repeated description will not be made below. In the charged particle beam device according to the third embodiment, the tip portion as the irradiation port of the guide 12 has a hollow structure that is axisymmetric.

In the configuration illustrated in FIG. 6, by shielding the tip of the guide 12 with the lower magnetic path 5B, the distortion of the electric field of the electron beam optical system PS is prevented. On the other hand, in the embodiment, the electric field distortion is suppressed using the tip shape of the guide 12. In order to suppress the electric field distortion, the lower magnetic path of the objective lens 5 is used in the first embodiment, and the trap plate 17 is used in the second embodiment. In both of the embodiments, the axisymmetric component in the charged particle beam device is used. Therefore, the introduction of the plasma is restricted depending on the disposition of the component of the charged particle beam device.

In the embodiment, an electrode member 20 that has an axisymmetric structure with respect to the optical axis is provided in the tip portion of the guide 12 that has an asymmetric structure with respect to the optical axis. Since the electrode member 20 has the axisymmetric structure with respect to the optical axis, electric field distortion is not generated with respect to the electron beam optical system PS or the equipotential line EPL2 that boosts the secondary electrons. Therefore, the influence on the trajectory of the secondary electrons 10 or the detection rate of the secondary electron detector 8 can be reduced, and image distortion or the like can also be suppressed.

Unlike the first embodiment, by uniformly irradiating the plasma from the surrounding of the irradiation position of the electron beam 2 instead of from the single side, uniform static elimination or charge control having a small unevenness can be performed. In addition, the irradiation port can be configured without depending on the configuration of the charged particle beam device. Therefore, the plasma irradiation can be performed in a very close range to the sample 6, the distance between the guide 12 and the sample 6 can be reduced, and static elimination or charge control can be efficiently performed.

This way, the electrode member 20 has the axisymmetric structure with respect to the optical axis, and thus electric field distortion does not occur. In addition, by changing the voltage of the voltage source 16, this embodiment is applicable not only to charge control but also a control of the irradiation energy of the primary electrons, the boosting of the secondary electrons 10, or the like.

The present invention is not limited to the embodiment and includes various modification examples. For example, the embodiments have been described in detail in order to easily describe the present invention, and the present invention is not necessarily to include all the configurations described above. In addition, a part of the configuration of one embodiment can be replaced with the configuration of another embodiment. Further, the configuration of one embodiment can be added to the configuration of another embodiment. In addition, addition, deletion, and replacement of another configuration can be made for a part of the configuration each of the embodiments.

In addition, some or all of the above-described respective configurations, functions, processing units, processing means, and the like may be realized by hardware, for example, by designing an integrated circuit. In addition, the respective configurations, functions, and the like may be realized by software by a processor interpreting and executing a program that realizes each of the functions. Information of a program, a table, a file, or the like that realizes each of the functions can be stored in a recording device such as a memory, a hard disk, or an SSD (Solid State Drive) or a recording medium such as an IC card, an SD card, or a DVD.

What is claimed is:

1. A charged particle beam device comprising:
a sample chamber including a stage on which a sample is placed;
a charged particle beam optical system configured to irradiate the sample with a charged particle beam;
a plasma generation device attached to the sample chamber through a connecting member;
a guide including a hollow portion configured to guide a plasma generated by the plasma generation device in a direction toward the stage;
a first voltage source configured to apply a voltage to the stage; and
a second voltage source configured to adjust the plasma generation device and the guide to a predetermined potential,
wherein the charged particle beam optical system includes an objective lens configured to focus the charged particle beam on the sample, and
the guide is disposed to avoid an opening of the objective lens through which the charged particle beam passes and to position a tip of the guide between the objective lens and the stage.

2. The charged particle beam device according to claim 1, wherein static elimination of the sample is performed or charging of the sample is controlled by a plasma irradiated from the tip of the guide to the sample or by charged particles generated by the plasma.

3. The charged particle beam device according to claim 1, wherein the potential of the plasma generation device and the guide adjusted by the second voltage source is the same as a potential of the stage adjusted by the first voltage source.

4. The charged particle beam device according to claim 1, wherein the connecting member electrically insulates the plasma generation device from the sample chamber.

5. The charged particle beam device according to claim 1, wherein the objective lens is an out-lens objective lens, and
the tip of the guide is disposed between a lower magnetic path of the out-lens objective lens and the stage.

6. The charged particle beam device according to claim 1, wherein a hollow electrode member that is axisymmetric is connected to the tip of the guide,
the objective lens has an axisymmetric structure, and
a central axis of the electrode member and a central axis of the objective lens are disposed to match each other.

7. A charged particle beam device comprising:
a sample chamber including a stage on which a sample is placed and a trap plate that is disposed to face the stage;
a charged particle beam optical system configured to irradiate the sample with a charged particle beam;
a plasma generation device attached to the sample chamber through a connecting member;
a guide including a hollow portion configured to guide a plasma generated by the plasma generation device in a direction toward the stage;
a first voltage source configured to apply a voltage to the stage; and
a second voltage source configured to adjust the plasma generation device and the guide to a predetermined potential, wherein the charged particle beam optical system includes an objective lens configured to focus the charged particle beam on the sample, the trap plate is disposed between the objective lens and the stage, the guide is connected to the trap plate, an irradiation port is provided in a surface of the trap plate facing the stage, and the hollow portion of the guide and the irradiation port are connected through an internal space of the trap plate.

8. The charged particle beam device according to claim 7, wherein static elimination of the sample is performed or charging of the sample is controlled by a plasma irradiated from the irradiation port of the trap plate to the sample or by charged particles generated by the plasma.

9. The charged particle beam device according to claim 7, wherein the stage fixes the sample using an electrostatic chuck.

10. The charged particle beam device according to claim 7, wherein a through hole through which the charged particle beam passes is provided in the trap plate, a first irradiation port and a second irradiation port that are connected to the internal space are provided in a surface of the trap plate facing the stage such that the through hole is interposed between the first irradiation port and the second irradiation port, and the first irradiation port and the second irradiation port are provided in a movement direction of the stage.

11. The charged particle beam device according to claim 7, wherein a through hole through which the charged particle beam passes is provided in the trap plate, and the irradiation port has a concentric arc shape with respect to the through hole.

12. The charged particle beam device according to claim 7, wherein the connecting member electrically insulates the plasma generation device from the sample chamber.

* * * * *